United States Patent [19]

Tanaka et al.

[11] Patent Number: 5,366,919
[45] Date of Patent: Nov. 22, 1994

[54] METHOD OF MAKING A MEMORY CELL OF A SEMICONDUCTOR MEMORY DEVICE

[75] Inventors: Kimiaki Tanaka; Hideki Takeuchi, both of Tokyo, Japan

[73] Assignee: Nippon Steel Corporation, Tokyo, Japan

[21] Appl. No.: 135,532

[22] Filed: Oct. 13, 1993

[30] Foreign Application Priority Data

Oct. 14, 1992 [JP] Japan .................................. 4-301732

[51] Int. Cl.$^5$ .......................................... H01L 21/70
[52] U.S. Cl. .......................................... 437/52; 437/47; 437/60; 437/919; 437/977
[58] Field of Search .................. 437/47, 48, 52, 60, 437/202, 977, 919; 257/309

[56] References Cited

U.S. PATENT DOCUMENTS

| | | | |
|---|---|---|---|
| 5,102,832 | 4/1992 | Tuttle | 437/977 |
| 5,134,086 | 7/1992 | Ahn | 437/977 |
| 5,244,842 | 9/1993 | Cathey et al. | 437/977 |
| 5,302,540 | 4/1994 | Ko et al. | 437/47 |

OTHER PUBLICATIONS

Rugged Surface Poly-Si Electrode and Low Temperature Deposited Si$_3$N$_4$ for 64 MBit and Beyond SIC DRAM Cell, Yoshimaru et al., IDEM 1990 pp. 659-662.

*Primary Examiner*—Tom Thomas
*Attorney, Agent, or Firm*—Pollock, Vande Sande & Priddy

[57] ABSTRACT

A method of making a memory cell having a transistor and a capacitor of a semiconductor memory device comprises the steps of: forming on a substrate on a surface of which the transistor is formed, an interlayer insulating film having a contact hole reaching a selected portion of the transistors; introducing a selected metal into a surface of the selected portion of the transistor exposed to the contact hole and a surface of the interlayer insulating film at portions thereof where a lower electrode of the capacitor is to be formed; forming a first conductive film having a pattern of the lower electrode of the capacitor by depositing a selected conductive material on the portions where the selected metal has been introduced; forming a capacitor insulating film on the first conductive film; and forming a second conductive film which provides an upper electrode of the capacitor on the capacitor insulating film; wherein the selected conductive material and the selected metal have such a relationship with each other that, when the first conductive layer is formed by depositing the selected conductive material on the portions where the selected metal has been introduced, the selected metal acts as a catalyzer to cause the selected conductive material to develop whisker crystal growth, thereby forming fine projections on an upper surface of the first conductive film.

4 Claims, 2 Drawing Sheets

METHOD OF MAKING A MEMORY CELL OF A SEMICONDUCTOR MEMORY DEVICE

CROSS-REFERENCE TO RELATED APPLICATIONS

This application relates to co-pending U.S. patent application Ser. No. 08/131,609 filed on Oct. 5, 1993, corresponding to Japanese Patent Application No. 4-297702 filed on Oct. 9, 1992.

BACKGROUND OF THE INVENTION

1. Field of the Invention

The present invention relates to a method of making a memory cell of a semiconductor memory device, and more particularly to a method of making a memory cell of a semiconductor memory device such as a DRAM.

2. Description of the Related Art

In a DRAM which is one of typical memory integrated circuits, each memory cell is constituted of a MOS transistor and a capacity element (capacitor), and information is written in or read out of the memory cell by storing or detecting electric charges in the capacitor through switching operation of the MOS transistor.

As a capacitor of the DRAM memory cell, a stacked capacitor in which a conductive thin film (a cell plate) of a second layer is laminated on a conductive thin film (a storage node) of a first layer is widely used.

An example of a conventional DRAM memory cell using the stacked capacitor cell is shown in FIG. 3.

As shown in FIG. 3, a gate oxide film 102 and a gate electrode 103 are formed on a silicon substrate 101. Source and drain regions 104 are formed in the silicon substrate 101 in self-alignment manner with respect to the gate electrode 103. Thus, the MOS transistor as an access transistor is formed of the gate electrode 103 and the source and drain regions 104.

A storage node (a lower electrode) 112 is connected to a source or drain region 104 through a contact hole 106 formed in an interlayer insulator 105. Further, a reference numeral 113 represents a capacitor insulator, and 114 represents a cell plate (an upper electrode). A capacitor is formed of the upper electrode 114, capacitor insulator 113 and lower electrode 112. The memory cell is constituted of the access transistor described above and the capacitor.

As a semiconductor memory device is more highly integrated in recent years, the number of elements in one chip is increased and the space for each capacitor is reduced.

Accordingly, in a DRAM memory cell having a stacked capacitor structure described above, the capacitance of the capacitor is no longer sufficient with the reduction of the space for the capacitor and it is difficult to ensure sufficient reliability in reading and writing information stably out of and in the memory cell in a highly integrated circuit element having a memory capacity of 64M bits or more for instance.

Accordingly, in order to increase the capacitance of a capacitor having a limited space, a method is proposed to form a plurality of fine projections on an upper surface of a lower electrode of a capacitor so as to increase the effective electrode area, thereby to increase the capacity of the capacitor as described in IEDM (1990) pp 659~662.

According to this method, in the process of depositing a polycrystalline silicon thin film which provides the lower electrode on a semiconductor substrate by a CVD method, an amorphous silicon thin film is deposited while controlling temperature and pressure for forming the thin film, thereby to form a plurality of fine projections on the upper surface of this thin film.

However, this method involves problems such that, when the lower electrode of a stacked capacitor is formed using the method described above, it is necessary to repeat deposition several times in order to obtain a thin film having a desired thickness, since the fine projections on the upper surface of the thin film is reduced when the desired thickness of 0.2 μm of the thin film is formed by deposition in one time, or precise temperature control is required with allowance of ±5° C. or less since the size of the fine projection depends delicately on the temperature at which the thin film is formed. Thus, the control of a process of forming a thin film is complicated.

SUMMARY OF THE INVENTION

It is an object of the present invention to provide a method of making a memory cell having a transistor and a capacitor of a semiconductor memory device such as a DRAM, in which a plurality of fine projections are formed on an upper surface of a conductive layer providing an upper electrode of the capacitor in order to increase the capacitance of the capacitor.

A method of making a memory cell having a transistor and a capacitor of a semiconductor memory device according to the present invention comprises the steps of: forming, on a semiconductor substrate on a surface of which the transistor is formed, an interlayer insulating film having a contact hole reaching a selected portion of the transistors; introducing a selected metal into a surface of the selected portion of the transistor exposed to the contact hole and a surface of the interlayer insulating film at portions thereof where a lower electrode of the capacitor is to be formed; forming a first conductive film having a pattern of the lower electrode of the capacitor by depositing a selected conductive material on the portions where the selected metal has been introduced; forming a capacitor insulating films on the first conductive film; and forming a second conductive film providing an upper electrode of the capacitor on the capacitor insulating film; wherein the selected conductive material and the selected metal have such a relationship with each other that, when the first conductive layer is formed by depositing the selected conductive material on the portions where the selected metal has been introduced, the selected metal acts as a catalyzer to cause the selected conductive material to develop whisker crystal growth, thereby forming fine projections on an upper surface of the first conductive film.

In the present invention, since the first conductive film which provides the lower electrode of the capacitor develops whisker crystal growth forming columnar structure by means of catalyzer action of the selected metal, which has been introduced into a predetermined portion of a transistor exposed to the inside of the contact hole such as the diffused layer providing a source or drain region, and into a predetermined portion of the insulating film, the lower electrode is formed of the first conductive film having an upper surface formed with fine projections.

DESCRIPTION OF THE PREFERRED EMBODIMENTS

An embodiment of the present invention will be described hereinafter with reference to FIGS. 1A to 1C and FIG. 2.

Figure 1A:
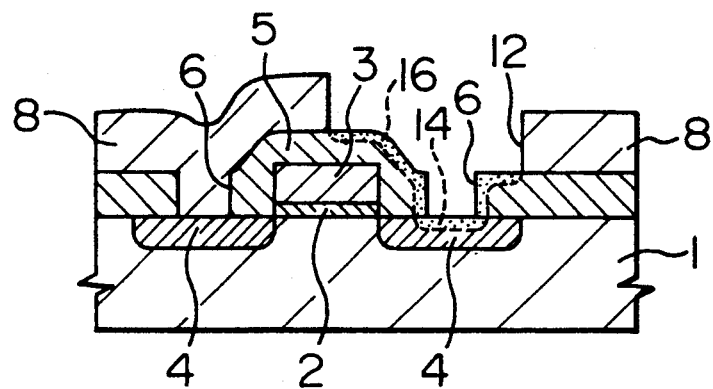
FIGS. 1A to 1C are sectional views of a memory cell at the respective steps of a method of making a memory cell of a DRAM according to an embodiment of the present invention.

First, as shown in FIG. 1A, an interlayer insulating film 5 is formed by depositing a $SiO_2$ film on a silicon substrate 1 on which a gate oxide film 2, a gate electrode 3 and source and drain regions 4 are formed, and contact holes 6 reaching the source and drain regions 4 are formed using photolithography technique and etching technique.

Thereafter, a resist film 8 is applied to an upper side of the insulating film 5, and patterned so that an opening is formed at its portion where a lower electrode 9 is to be formed, as will be described later. At this time, the opening of the resist film 8 is formed so as to include one of the contact holes formed in the interlayer insulating film 5, as shown in the figure. After the patterning, tungsten ions are introduced at a concentration of approximately $1 \times 10^{10}/cm^3$ into a surface portion 14 of the source or drain region 4 which is exposed to the contact hole 6 and a surface portion 16 of the $SiO_2$ film 5 which is exposed to an opening 12 by an ion injection method. This injection is made so that tungsten ions are injected to a depth of approximately 10% of the thickness of the source or drain region 4. Further, it is also possible to introduce tungsten by means of coating of an aqueous solution of tungsten instead of injection of tungsten ions.

Figure 1B:
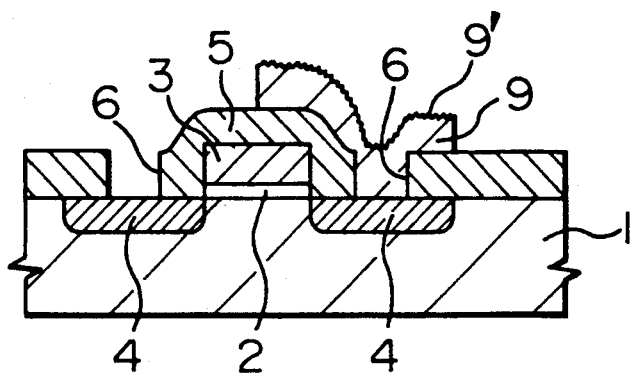

Next, as shown in FIG. 1B, after the resist film 8 is removed, a polycrystalline silicon film 9 which provides a lower electrode of the capacitor is deposited selectively on the silicon substrate 1 and the $SiO_2$ film 5 into which tungsten ions have been introduced by a CVD method at a temperature of 300° C. to 450° C. and an atmospheric pressure of approximately 0.1 to 760 Torr using silane gas as a source material.

Figure 1C:
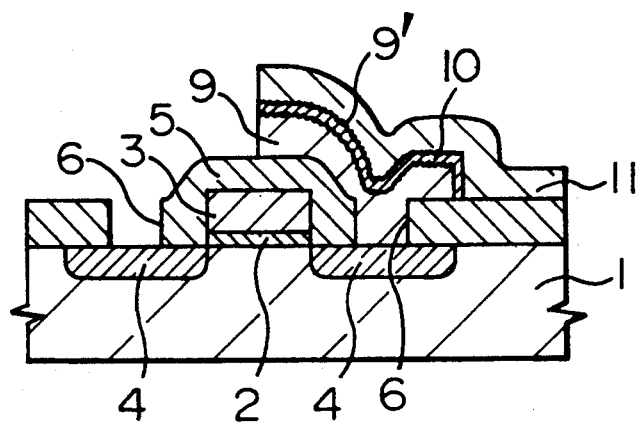

Besides, the portions 12 and 14 where tungsten ions are injected are omitted in FIGS. 1B and 1C.

Figure 2:
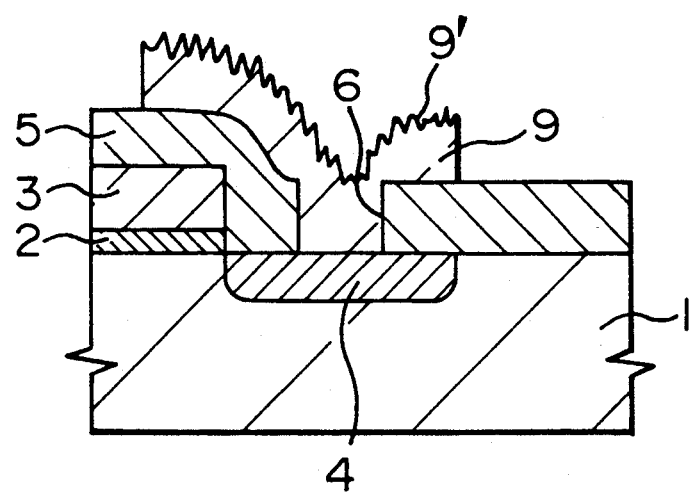
FIG. 2 is a sectional view showing a configuration of a lower electrode of a capacitor of a memory cell manufactured according to an embodiment of the present invention.
Figure 3:
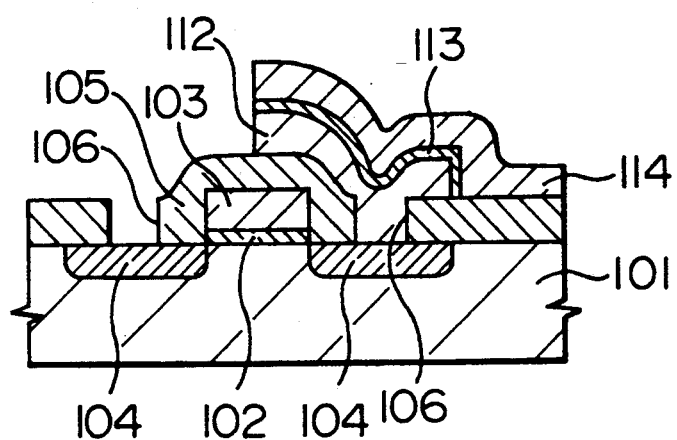
FIG. 3 is a sectional view showing a structure of a conventional DRAM memory cell.

In this selective deposition, silane is not decomposed at all in a portion where no tungsten ion exists, but polycrystalline silicon is subjected to selective deposition to develop whisker crystal extending in a columnar structure by catalyzer action of tungsten only at a portion where tungsten ions exist, and as shown in FIG. 2, fine projections 9' are formed on the surface of the lower electrode 9 and the effective surface area of the lower electrode 9 is about three to five times as large as a conventional structure. Next, As or P ions are injected into the polychrystalline silicon to make it conductive.

Next, as shown in FIG. 1C, a silicon nitride film is deposited on the whole surface of the lower electrode 9 by a CVD method at the temperature of 700° C. to 850° C. and the pressure of approximately 0.1 to 1.0 Torr using $SiH_2Cl_2$—$NH_3$ gas as a source. Thereafter, a thermal oxidization is applied at 800°~1000° C. to form a capacitor insulating film 10 of ONO (oxide, nitride, oxide) three-layer. At this time, fine projections corresponding to fine projections on the surface of the lower electrode 9 are also produced on the upper surface of the insulating film 10.

Next, a polycrystalline silicon film 11 is deposited on the whole surface of the insulating film by a CVD method at the temperature of 300° C. to 450° C. and the pressure of approximately 0.1 to 760 Torr using silane gas as a source. Thereafter, phosphorus is diffused into the film 11 within atmospheric gas of phosphorus oxychloride at 800°~900° C. and then, the ONO film and the polycrystalline silicon film 11 are together patterned by photolithography technique and etching technique thereby to form an upper electrode 11.

Since fine projections 9' are formed on the upper surface of the lower electrode 9 of the stacked capacitor as described above according to the present embodiment, it is possible to increase the effective surface area of the lower electrode 9 as compared with a conventional structure. As a result, the capacitor capacitance of the stacked capacitor can be increased, thus making it possible to write and read information in and from the memory cell stably also in a DRAM having a memory capacity of 64M bits.

Besides, in an integrated circuit corresponding to a 64 M bit DRAM produced by the process described above, the capacitor capacitance as measured is 40 $fF/\mu m^2$. This is three to four times as large as the capacitor capacitance in a conventional structure and sufficient to be used in a memory circuit.

The present invention has been described referring to one embodiment, but the present invention is not limited to the embodiment described above.

For example, tungsten is used in the embodiment as a catalyzer to be introduced, but it is also possible to use one or more metals selected from a group of iron, chrome, nickel, gold, silver, copper, molybdenum, aluminum and platinum as the catalyzer to be introduced.

Further, the catalyzer metal has been introduced by an ion injection method in the embodiment described above, but similar effects are also obtained by using sputtering, vapor deposition or direct spraying of metal particles.

Besides, the quantity of the introduced metal may be a very small to an extent of generating catalyzer action.

Further, the lower electrode 9 has been formed of a polycrystalline silicon film in the embodiment described above, but any conductive material which develops whisker crystal growth by the catalyzer action of the metal may be used. Useful conductive material includes, for example, tungsten, tungsten silicide, titanium or the like depending on the combination with the metal providing the catalyzer action.

Namely, as the conductive material of the lower electrode and the metal introduced into the regions 14 and 16, any combination of a conductive material and a metal may be used so long as they have such an interaction that the conductive layer develops whisker crystal growth by the catalyzer action of the metal so as to form fine projections on the upper surface of the conductive layer when the lower electrode is formed by depositing the conductive material on the regions 14 and 16.

As described above, since fine projections are formed on the upper surface of the lower electrode of the capacitor according to the present invention, it is possible to provide a sufficient capacitor capacitance, thus making it possible to manufacture a semiconductor memory device capable of writing and reading information in and from the memory cell, when applied, for example, to a DRAM having a memory capacity of 64 M bits or more.

What is claimed is:

1. A method of making a memory cell having a transistor and a capacitor of a semiconductor memory device, comprising the steps of:

forming, on a substrate in a surface of which the transistor is formed, an interlayer insulating film having a contact hole reaching a source/drain region of said transistor;

introducing a metal into a surface of said source/drain region of said transistor exposed to said contact hole and a surface portion of said interlayer insulating film at portions thereof where a lower electrode of said capacitor is to be formed;

forming a first conductive film having a pattern of the lower electrode of said capacitor by depositing a conductive material on the portions where said metal has been introduced;

forming a capacitor insulating film on said conductive film; and forming a second conductive film which provides an upper electrode of said capacitor on said capacitor insulating film;

wherein said conductive material and said metal have such a relationship with each other that, when said first conductive film is formed by depositing the conductive material on the portions where the metal has been introduced, said metal acts as a catalyzer to cause said conductive material to develop whisker crystal growth, thereby forming fine projections on an upper surface of said first conductive film.

2. A method according to claim 1, wherein said first conductive film is a polycrystalline silicon film.

3. A method according to claim 1, wherein said metal includes at least one selected from the group consisting of tungsten, iron, chrome, nickel, gold, silver, copper, molybdenum, aluminum and platinum.

4. A method according to claim 3, wherein said first conductive film is a polycrystalline silicon film.

* * * * *